United States Patent
Iwanaga et al.

(10) Patent No.: US 7,239,161 B2
(45) Date of Patent: Jul. 3, 2007

(54) GANTRY-TYPE XY STAGE

(75) Inventors: Yasushi Iwanaga, Kanagawa (JP); Kazuhiko Mitobe, Kanagawa (JP)

(73) Assignee: Laserfront Technologies, Inc., Kanagawa (JP)

( * ) Notice: Subject to any disclaimer, the term of this patent is extended or adjusted under 35 U.S.C. 154(b) by 254 days.

(21) Appl. No.: 10/974,753

(22) Filed: Oct. 28, 2004

(65) Prior Publication Data

US 2006/0023206 A1 Feb. 2, 2006

(30) Foreign Application Priority Data

Jul. 30, 2004 (JP) ............... 2004-224773

(51) Int. Cl.
*G01R 31/02* (2006.01)
(52) U.S. Cl. ............... 324/758; 324/757; 324/158.1; 356/244
(58) Field of Classification Search ......... 324/758, 324/757, 158.1; 356/244; 250/442.11
See application file for complete search history.

(56) References Cited

U.S. PATENT DOCUMENTS 5,543,726 A * 8/1996 Boyette et al. ............. 324/758

FOREIGN PATENT DOCUMENTS

| JP | 61-76239 | 4/1986 |
|---|---|---|
| JP | 11-116696 | 4/1999 |
| JP | 11-235622 | 8/1999 |
| JP | 11-277351 | 10/1999 |
| JP | 2000-263356 | 9/2000 |
| JP | 2002-158274 | 5/2002 |
| JP | 2002-192426 | 7/2002 |
| JP | 2002-521214 | 7/2002 |
| WO | WO 00/05028 | 2/2000 |

OTHER PUBLICATIONS

Document describing a gantry-type XY-stage sold by Sumitomo Heavy Industries, Ltd.
High Precision XY Stage for Large Size FPD Substrate, SIGMA Co., Ltd.

* cited by examiner

*Primary Examiner*—Kiet T. Nguyen
(74) *Attorney, Agent, or Firm*—Young & Thompson

(57) ABSTRACT

Nine vibration isolating mounts are disposed on a pedestal, and a granite plate is placed thereon. A pair of guide bases are disposed on the granite plate, and disposed thereon are a pair of posts made of CFRP for movements in a Y-direction relative to the granite plate. A beam made of CFRP is extended between the pair of posts. Further, a movement base is disposed for movement in an X-direction relative to the beam, and a laser optical unit is mounted on the movement base.

11 Claims, 3 Drawing Sheets

GANTRY-TYPE XY STAGE

BACKGROUND OF THE INVENTION

1. Field of the Invention

The present invention relates to a gantry-type XY stage for use in an apparatus which performs local processing on a plane structure, and more particularly, to a gantry-type XY stage for use in a laser repair apparatus for liquid crystal displays, a laser repair apparatus for liquid crystal masks, a patterning apparatus for solar cell panels, a defect inspection apparatus for liquid crystal displays, a defect inspection apparatus for semiconductor devices, and the like.

2. Description of the Related Art

A laser repair apparatus for correcting manufacturing defects on a TFT (Thin Film Transistor) substrate of a liquid crystal display is provided with a gantry-type XY stage as a main component unit. The gantry-type XY stage is comprised of a base section which is a stationary portion, and a gantry section which is a movable portion disposed on the base section. The base section is provided with a granite plate, the top of which is an even stage surface. Also, the gantry section is provided with a pair of posts disposed on the granite plate for movements in a direction (Y-direction), and a beam (ridgepole) extended between top ends of the pair of posts. Then, a laser optical unit is mounted on the beam for movements in a direction (X-direction) orthogonal to the direction (Y-direction). Such a technology is disclosed in the home page of Sigma Co., Ltd. (http://www.sigma-fa.co.jp/2_3.html)[searched on Jul. 28, 2004], and in the home page of Sumitomo Heavy Industries, Ltd. (http://www.shi.co.jp/stage/prellys/20030318.htm) [searched on Jul. 28, 2004].

With such a structure, a liquid crystal display to be repaired is carried on the granite plate of the base section, the gantry section moves the laser optical unit to position this unit immediately above a defective portion of the liquid crystal display, such that the laser optical unit can irradiate the defective portion with laser light to repair the defective portion.

The gantry-type XY stage for use in such a laser repair apparatus for liquid crystal displays and the like is required to provide an extremely high shape accuracy with errors within approximately 10 µm. For this reason, the granite plate is fabricated by precisely machining a single large block of granite or the like. An extremely high shape accuracy is also required to the posts and beam, which make up the gantry section. Thus, in conventional gantry-type XY stages, the posts and beam of the gantry section are formed by polishing and processing castings of iron or iron alloy (hereinafter collectively called "iron casting"). This is because the gantry section formed of forging, for example, rolled steel would inevitably suffer from bowing in the rolling direction, thereby failing to ensure a sufficient shape accuracy. Also, the posts and beam, when formed of iron castings, can maintain a high shape accuracy because the iron has a Young's modulus of approximately 206 GPa and therefore a high rigidity, so that they can suppress deformations such as deflection due to their own weights, twisting associated with movements, and the like.

However, the aforementioned prior art technique has problems as shown below. Generally, for manufacturing TFT substrates for liquid crystal displays, multiple-chamfering is performed for simultaneously forming a plurality of TFT substrates on a single mother glass. Recently, there is a tendency of increasing the number of TFT substrates formed on a single mother glass for reducing the manufacturing cost of liquid displays. This drives mother glasses to become larger in size year by year, and associated with this, an increase in size is also under way in XY stages for use in laser repair apparatuses for liquid crystal displays. Consequently, the gantry section increases in mass, and moves over a longer distance.

As a result, when the gantry section is moved at high speeds, its moment of movement causes the granite plate of the base section to wobble, and the wobbles are transmitted to a laser processing unit attached to the gantry section. This causes wobbles in an image for observing a liquid crystal display to be repaired. Then, since the liquid crystal display cannot be processed for repair until the wobbles comes to end, causing a longer processing time per liquid crystal display. When the gantry section is moved at low speeds, the occurrence of wobbles can be limited, but the processing time per liquid crystal display will become longer after all.

SUMMARY OF THE INVENTION

The present invention has been made in view of the foregoing problems, and its object is to provide a gantry-type XY stage which reduces wobbles associated with movements of a gantry section.

A gantry-type XY stage according to the present invention has a granite plate, a pair of posts made of a first composite material having a Young's modulus of 200 GPa or more, disposed on the granite plate spaced apart from one another in a first direction parallel to a top of the granite plate for movements in a second direction intersecting with the first direction, a beam made of a second composite material having a Young's modulus of 200 GPa or more, extended between the pair of posts, and a movement base disposed for movements in the first direction relative to the beam.

In the present invention, since the posts and beam are formed of a composite material having a Young's modulus of 200 GPa or more, the posts and beam can be reduced in weight while their rigidities are maintained. Thus, a counter force applied to the granite plate is small when the posts and beam are moved in the second direction, thereby making it possible to limit the wobbles of the granite plate and as a result, limit the wobbles of the posts and beam. Consequently, it is, possible to reduce a settle time until the wobbles come to end and to move the posts and beam at high speeds with large acceleration/deceleration.

At least one of the first and second composite materials is preferably carbon fiber reinforced plastics. Since the carbon fiber reinforced plastics have a high vibration absorbency and a high vibration damping effect, they can more effectively limit the wobbles of the posts and beam.

Further preferably, the beam is a hollow body comprising a shell formed with a first hole through a top thereof, and the gantry-type XY stage has a linear guide bearing for guiding movements of the movement base which is made of a metal or a metal alloy, disposed on the top of the beam, and formed with a second hole at a position in alignment to the first hole, a backing member made of a metal or a metal alloy, disposed at a position opposite to the linear guide bearing across the shell within the beam, and formed with a third hole at a position in alignment to the first hole, and a securing member for securing the linear guide bearing to the beam through the second hole, first hole and third hole.

By making the beam hollow, it is possible to reduce the amount of used composite material which makes up the beam. In this way, the material cost can be reduced, and the beam can be further reduced in weight. Also, by securing the linear guide bearing to the beam using the backing member made of a metal or an alloy, the secured portion can be prevented from shaking. Consequently, the shape accuracy of the linear guide bearing can be prevented from a degradation over time.

In this event, a supporting member made of the second composite material and extending in the vertical direction is preferably disposed within the beam. Thus, the supporting member counteracts a deflection caused by the own weight of the beam, and twisting associated with movements of the posts and beam, so that the shell can be reduced in thickness, and the beam can be further reduced in weight.

Furthermore, a top of the beam and bottoms of the posts are preferably ground after the beam is bonded to the posts. In this way, the distance between the top of the beam and the bottoms of the posts can be made more strictly consistent.

Furthermore, the gantry-type XY stage according to the present invention may be installed in a defect testing apparatus for a liquid crystal display or in a defect testing apparatus for a semiconductor device. Alternatively, the gantry-type XY stage may have a laser irradiator fixed to the movement base, and be installed in a laser repair apparatus for liquid crystal displays, a laser repair apparatus for liquid crystal masks, or a patterning apparatus for solar cell panels. The liquid crystal mask refers to a mask which serves as an original plate for fabricating TFT substrates for liquid crystal displays.

In the following, an embodiment of the present invention will be described in a specific manner with reference to the accompanying drawings.

DETAILED DESCRIPTION OF THE PREFERRED EMBODIMENTS

Figure 1:
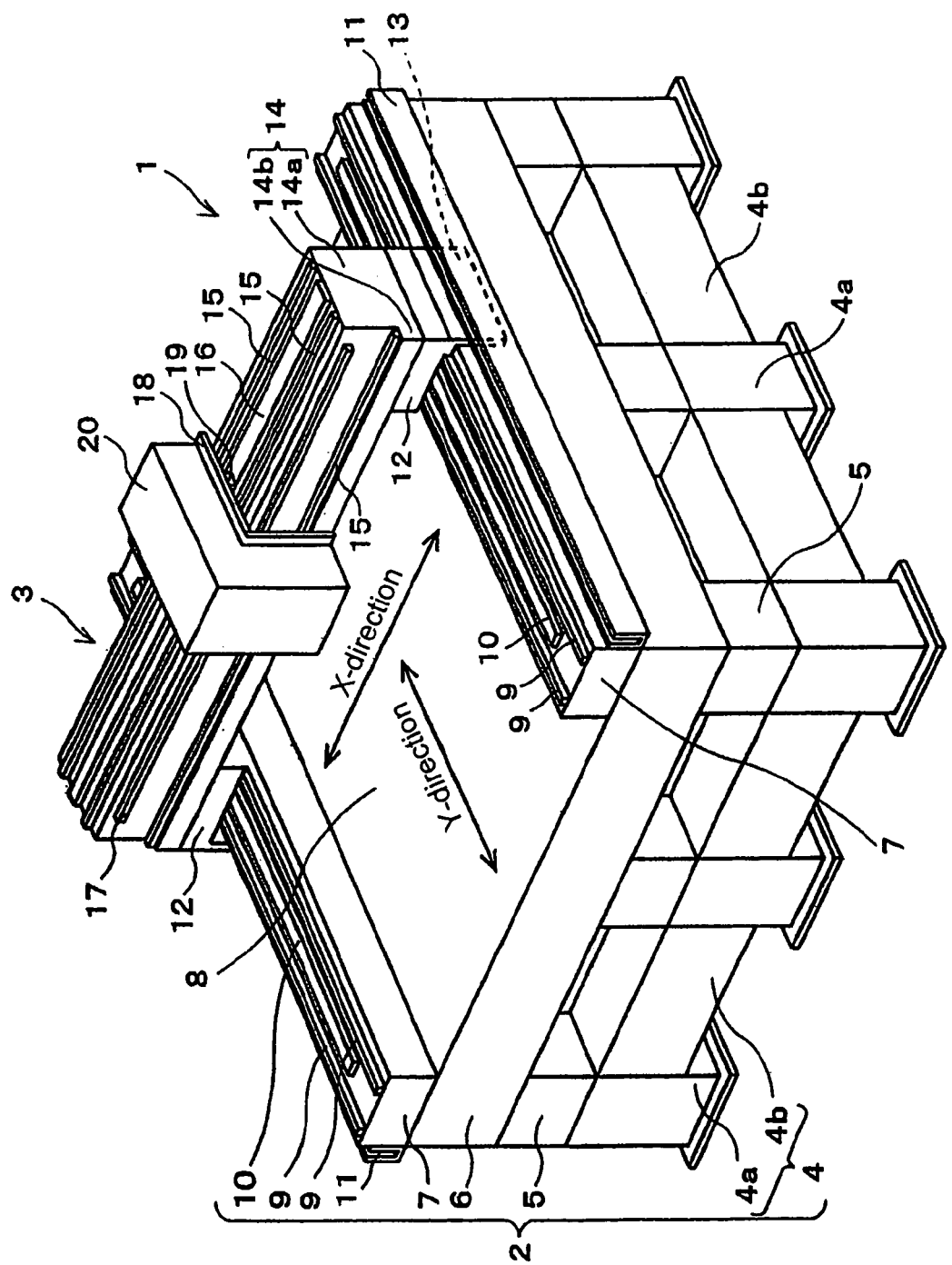
FIG. 1 is a perspective view illustrating a gantry-type XY stage according to an embodiment of the present invention.

A gantry-type XY stage according to an embodiment of the present invention is installed in a laser repair apparatus for correcting TFT substrates of liquid crystal displays for defects during manufacturing. As illustrated in FIG. 1, gantry-type XY stage 1 according to the embodiment is provided with base section 2, which is a stationary portion, and gantry section 3, which is a movable portion, carried on base section 2.

In base section 2, pedestal 4 is provided for supporting entire gantry-type XY stage 1. Pedestal 4 comprises nine posts 4a arranged at equal intervals in three rows and three columns; and beams 4b for coupling adjacent posts 4a to each other. Posts 4a and beams 4b are formed, for example, of rectangular steel pipes for general structures described in JIS (Japanese Industrial Standards) G3466. Also, each of posts 4a of pedestal 4 is provided thereon with each vibration isolating mount 5. In other words, a total of nine vibration isolating mounts 5 are provided. Vibration isolating mounts 5 are comprised, for example, of air springs. Each vibration isolating mount 5 is provided with a mechanical sensor (not shown) for automatically controlling its height in a passive manner. Alternatively, vibration isolating mount 5 may be provided with an electronic sensor such that the height is controlled in an active manner.

Further, granite plate 6, for example, comprised of a single block of granite, is disposed on nine vibration isolating mounts 5. Granite plate 6 is in the shape of rectangular plate, the top of which is flat. In the following, as illustrated in FIG. 1, out of directions parallel to the top of granite plate 6, an X-direction is defined in a direction in which a pair of sides extend on the top, and a Y-direction is defined in a direction in which the other pair of sides extend. The X-direction and Y-direction are orthogonal to each other. Granite plate 6 has a length of, for example, 3.0 m in the X-direction, and a length of, for example, 3.5 m in the Y-direction. Then, a pair of guide bases 7 are fixed along both edges which extend in the Y direction on the top of granite plate 6. Guide bases 7, which are made, for example, of cast iron, are columnar members extending in the Y-direction. Stage surface 8 is defined in an area between guide bases 7 on the top of granite plate 6.

A pair of linear guide bearings 9 are also disposed on the top of each guide base 7. Linear guide bearings 9 are formed, for example, of carbon steel. Linear guide bearings 9 guide movements of gantry section 3 in the Y-direction. A linear scale 10 is provided for detecting the position of gantry section 3 in the Y-direction in a region between linear guide bearings 9 on the top of guide base 7. Further, linear motor stator 11 is attached to one of side surfaces of guide base 7 extending in the Y-direction, which does not oppose the other guide base 7. Linear motor stator 11 extends in the Y-direction, and is formed with a groove which is open to the above. In other words, the cross-section of linear motor stator 11 orthogonal to the Y-direction is in an inverted C shape. Base section 2 is made up of pedestal 4, vibration isolating mounts 5, granite plate 6, guide bases 7, linear guide bearings 9, linear scales 10, and linear motor stators 11.

Also, a pair of posts 12 made of a composite material having a Young's modulus of 200 GPa or more, for example, CFRP (Carbon Fiber Reinforced Plastics) are disposed in gantry section 3. CFRP has a Young's modulus in a range of 200 to 600 GPa, and specific gravity of 1.6, by way of example. In addition, liner motor mover 13 is fixed below each post 12, such that linear motor movers 13 are positioned within the grooves of linear motor stators 11. Then, gantry section 3 is arranged to move in the Y-direction by a magnetic mutual action between linear motor stators 11 and linear motor movers 13.

Beam 14 made of a composite material having the Young's modulus of 200 GPa or more, for example, CFRP is extended between the pair of posts 12. In other words, beam 14 is a beam-shaped member which extends in the X-direction, and has both ends coupled to the tops of the pair of posts 12 to straddle over stage surface 8. Beam 14 is comprised of main body 14a in the shape of rectangular solid, and extension 14b which extends in the Y-direction from a lower portion of main body 14a. Thus, the cross-section of beam 14, orthogonal to the X-direction, has an L-shape. Beam 14 has a length of, for example, 2.8 m in the X-direction. Beam 14 is bonded to posts 12 with an adhesive. The top of beam 14 and the bottoms of posts 12 are ground after beam 14 is bonded to posts 12. The grinding involves first grinding posts 12 and beam 14 with a large grinding machine, and subsequently performing manual grinding for finish while measuring the shape with a measuring device.

A total of three linear guide bearings 15 are disposed, i.e., two on the top of main body 14a of beam 14 and one on the top of extension 14b. Linear guide bearing 15, which is formed, for example, of carbon steel, extends in the X-direction. Also, linear motor stator 16 extending in the X-direction is disposed in a region between two linear guide bearings 15 on the top of main body 14a. Linear motor stator 16 is formed with a groove open to one side (see FIG. 2), so that its cross-section orthogonal to the X-direction has an inverted C-shape. Further, linear scale 17 extending in the X-direction is attached on a side surface of main body 14a above extension 14b.

Further, movement base 18, made, for example, of a iron-made plate, is disposed so as to be movable in the X-direction relative to beam 14. The shape of movement base 18 orthogonal to the X-direction has an inverted L-shape which covers the top of beam 14 and the side of the same on which linear guide bearing 15 is disposed. Movement base 18 has the length in the X-direction shorter than the length of beam 14 in the X-direction. Linear motor mover 19 is attached on the bottom of movement base 18 so as to be positioned within the groove of linear motor stator 16. In this way, movement base 18 moves in the X-direction along linear guide bearings 15 by a magnetic mutual action of linear motor mover 19 and linear motor stator 16. Then, the position of movement base 18 in the X-direction is detected by linear scale 17.

Furthermore, laser optical unit 20 is mounted on the top of movement base 18 and on a side surface of the same which does not oppose beam 14. Laser optical unit 20, which has an inverted L-shape such that it covers the outer side surfaces of movement base 18, outputs an enlarged image of an object to be repaired, placed on stage surface 8, to the outside, and irradiates laser light toward the object to be repaired. Gantry section 3 is made up of posts 12, linear motor movers 13, beam 14, linear guide bearings 15, linear motor stator 16, linear scale 17, movement base 18, linear motor mover 19, and laser optical unit 20.

Figure 2:
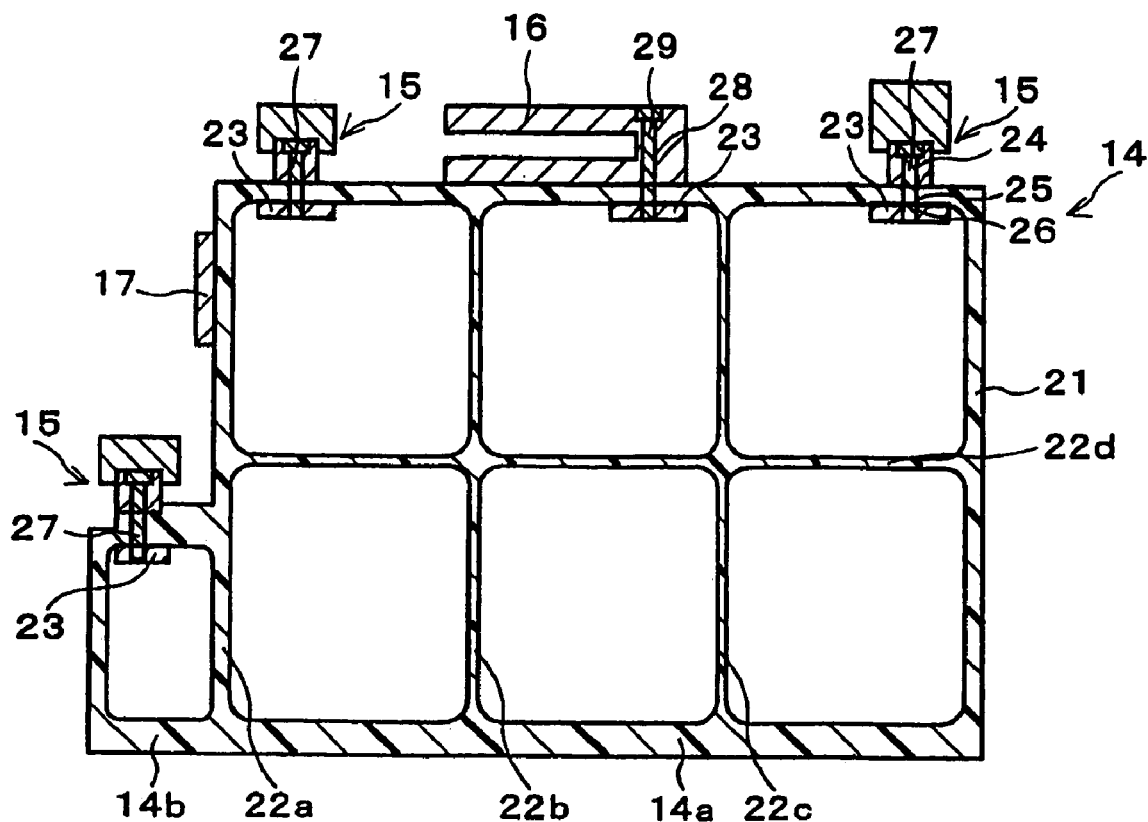
FIG. 2 is a cross-sectional view illustrating a beam and its surroundings of the gantry-type XY stage illustrated in FIG. 1.

The configuration of beam 14 will be described below in detail. FIG. 2 illustrates the cross-section of beam 14, which is orthogonal to the longitudinal direction (X-direction) of beam 14. As illustrated in FIG. 2, beam 14 is hollow and is provided with shell 21 which defines outer surfaces thereof. Then, plate-shaped supporting member 22a extending in the vertical direction is disposed to mutually define main body 14a and extension 14b. Also, within main body 14a, two plate-shaped supporting members 22b and 22c are disposed extending in the vertical direction. Further, within main body 14a, one plate-shaped supporting member 22d extending in the horizontal direction is disposed so as to be orthogonal to two supporting members 22b and 22c which extend in the vertical direction. In this way, the interior of main body 14a is partitioned into six compartments by supporting members 22b, 22c and 22d. Also, the interior of extension 14b includes one compartment separated from main body 14a by supporting member 22a. In other words, the interior of shell 21 is partitioned into seven compartments by plate-shaped supporting members 22a to 22d.

On the back of the top portion of shell 21 within shell 21, backing members 23 are disposed at positions opposite to linear guide rails 14 across shell 21. Backing materials 23, which are made of a metal or an alloy, for example, carbon steel, are strip-shaped plate materials extending in the X-direction. Linear guide rails 14 are formed with a plurality of holes 24 arranged in line along the X-direction, and holes 25 are formed through the top portion of shell 21 of beam 14 at positions in alignment to holes 24. Also, threaded holes 26 are formed through backing members 23 at positions in alignment to holes 24 and holes 25. Bolts 29 made of a metal or an alloy are disposed such that they are inserted through holes 24 and holes 25, and screwed into threaded holes 26. In this way, linear guide rails 15 are secured to beam 14.

Similarly, backing member 23 is also disposed on the back side of the top portion of shell 21 at a position opposite to linear motor stator 16 across shell 21. Also, linear motor stator 16 is formed with a plurality of holes 28 arranged in the X-direction; shell 21 is formed with holes 25 at positions in alignment to holes 28; and backing members 23 are formed with threaded holes 26 at positions in alignment to holes 28 and 25. Then, bolts 29 are disposed such that they are inserted through holes 28 and 25, and screwed into threaded holes 26. In this way, linear motor stator 16 is secured to beam 14. Alternatively, holes 25 may be threaded holes provided with heli-serts made of a metal or an alloy.

Gantry type XY stage 1 is incorporated in a liquid crystal display repair apparatus. This repair apparatus is provided with a movement controller (not shown) for driving linear motor stator 11 and linear motor mover 13 to move gantry section 3 in the Y-direction, and for driving linear motor stator 16 and linear motor mover 19 to move movement base 18 in the X-direction relative to beam 14. This repair apparatus is also provided with a laser controller (not shown) for driving laser optical unit 20 to capture an image of an object to be repaired, and for irradiating laser light to the object to be repaired. A display device (not shown) is further provided for displaying the image outputted from laser optical unit 20.

Next, description will be made on the operation of gantry-type XY stage 1 according to this embodiment, configured as described above. As illustrated in FIG. 1, first, a mother glass (not shown) formed with a plurality of TFT substrates of liquid crystal displays to be repaired, is placed on stage surface 8. Next, linear motor stator 11 and linear motor mover 13 are driven to move gantry section 3 in the Y-direction, and linear motor stator 16 and linear motor mover 19 are driven to move movement base 18 in the X-direction relative to beam 14, to place laser optical unit 20 at a position corresponding to a portion of a TFT substrate to be repaired. Next, laser optical unit 20 irradiates this portion to be repaired with laser light for repair. Then, by repeating such operations, a plurality of locations are repaired, thus repairing all portions to be repaired of the TFT substrates formed on this mother glass. Subsequently, this mother glass is removed from stage surface 8, and another mother glass is placed on stage surface 8 for repair.

Figure 3A:
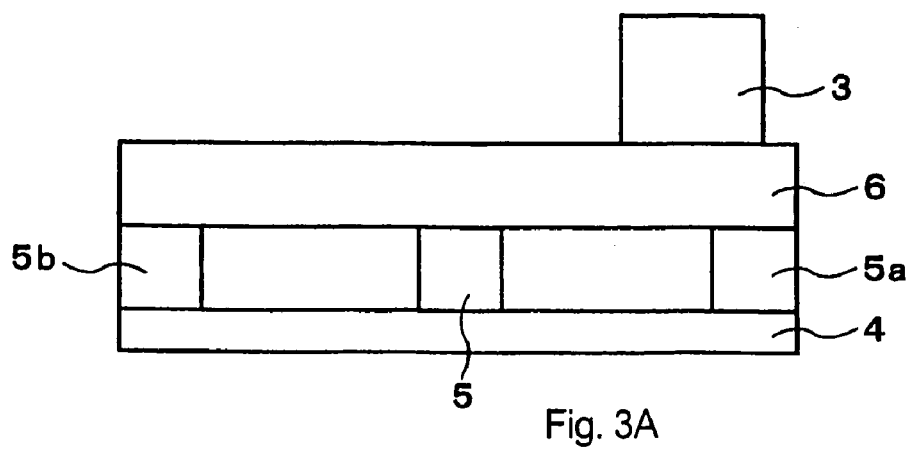
FIGS. 3A to 3D are side views illustrating the operation of the gantry-type XY stage illustrated in FIG. 1 over time.

Next, description will be made on the behavior of gantry-type XY stage 1 when gantry section 3 is moved in the Y-direction. FIG. 3A illustrates a state before gantry section 3 starts a movement. It should be noted that in FIGS. 3A to 3D, gantry section 3 and pedestal 4 are represented by simple rectangles, respectively, for simplifying the figures. Also, components other than gantry section 3, pedestal 4, vibration isolating mounts 5 and granite plate 6 are omitted in the illustration. As illustrated in FIG. 3A, before gantry section 3 starts a movement, gantry-type XY stage 1 is in a steady state, wherein the top of granite plate 6 is held even by vibration isolating mounts 5. Specifically, all vibration isolating mounts 5 are equal in height to one another, so that the height of vibration isolating mounts 5a positioned on the movement starting side of gantry section 3 is equal to the height of vibration isolating mount 5b positioned on the movement ending side.

Figure 3B:
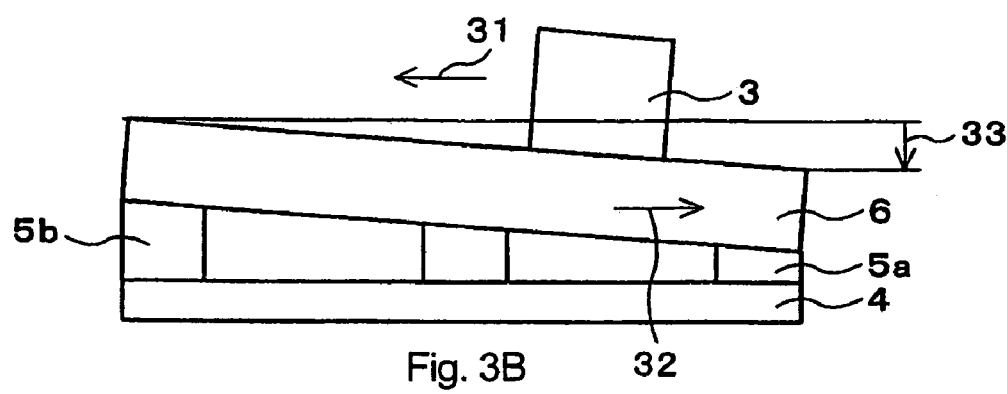

FIG. 3B illustrates a state in which gantry section 3 has started a movement and is accelerating. As illustrated in FIG. 3B, as gantry section 3 has started a movement in direction 31 and accelerates, its counter force 32 is applied to granite plate 6, thereby compressing vibration isolating mounts 5a in the vertical direction to cause granite plate 6 to subside. A subsiding amount at this time is designated subsiding amount 33.

Figure 3C:
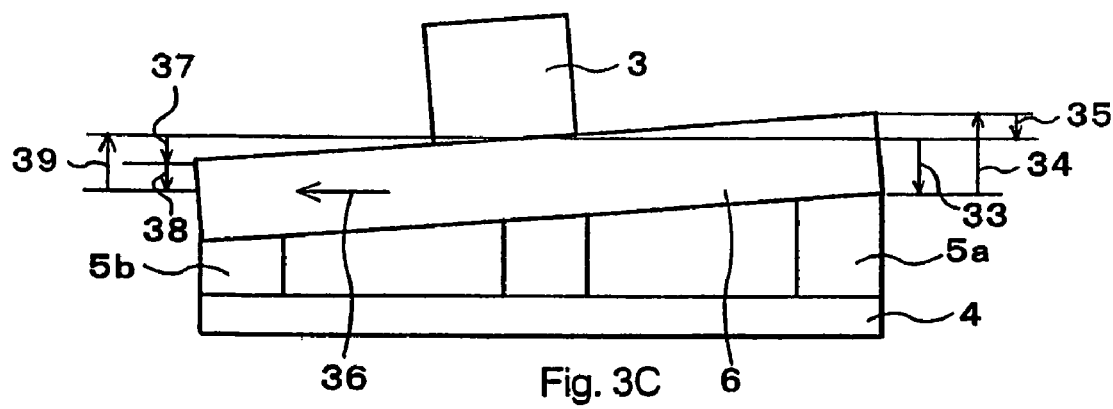

FIG. 3C illustrates a state in which gantry section 3 is decelerating. As illustrated in FIG. 3C, vibration isolating mount 5a, which was compressed by counter force 32 applied thereto in the acceleration period illustrated in FIG. 3B, pushes up granite plate 6 in order to return the position of granite plate 6 to a reference position in the decelerating period shown in FIG. 3C. However, at this time, gantry section 3 has moved from a region above vibration isolating mount 5a, and vibration isolating mount 5a is applied with a reduced load of gantry section 3, thus excessively pushing up granite plate 6 to result in overshooting. In other words, push-up amount 34 at this time is larger than subsiding amount 33. Subsequently, vibration isolating mount 5a pulls down an end portion of granite plate 6 near vibration isolating mount 5a. The sum of subsiding amount 35 at this time and aforementioned subsiding amount 33 becomes equal to push-up amount 34.

On the other hand, vibration isolating mount 5b positioned on the movement ending side of gantry section 3 is gradually applied with the load of gantry section 3, wherein as gantry section 3 is moved at higher speeds, fluctuations in its load become more steep to such an extent that the control based on the mechanical sensor of vibration isolating mount 5b cannot follow the fluctuations in the load. As a result, vibration isolating mount 5b can no longer hold the height of granite plate 6 at the reference position, with the result that an end portion of granite plate 6 near vibration isolating mount 5b go subsiding. A subsiding amount at this time is subsiding amount 37 shown in FIG. 3C. On the other hand, when gantry section 3 starts decelerating and stops, its counter force 36 is applied to vibration isolating mount 5b through granite plate 6, so that vibration isolating mount 5b is further compressed, causing the end portion of granite plate 6 near vibration isolation mount 5b to further subside. This subsiding amount is designated subsiding amount 38. Subsequently, vibration isolating mount 5b pushes up granite plate 6 in order to return the position of granite plate 6 to the original reference position. Push-up amount 39 at this time is equal to the sum of the aforementioned subsiding amounts 37 and 38.

Figure 3D:
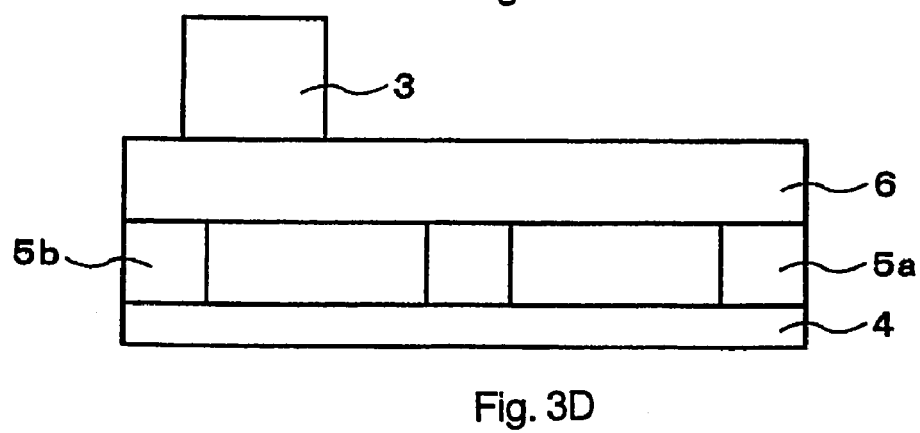

FIG. 3D illustrates a state in which gantry section 3 has completed the movement. As illustrated in FIG. 3D, vibration isolating mount 5 has returned the height of granite plate 6 to the reference position, and the top of granite plate 6 has returned to be even. In other words, gantry-type XY stage 1 has returned to the steady state.

Next, description will be made on advantages of this embodiment. As described above, vibration isolating mounts 5 operate as illustrated in FIGS. 3A to 3D as gantry section 3 moves, causing granite plate 6 to wobble in the direction in which gantry section 3 moves (Y-direction). Then, this wobble propagates to laser optical unit 20 through posts 12 and beam 14, causing laser optical unit 20 to wobble. For this reason, a repair cannot be performed until the wobble of laser optical unit 20 converges, thereby reducing the working efficiency.

This wobbling amount is smaller as the value of (Mc/Ms) is smaller, where Mc is the mass of gantry section 3, and Ms is the mass of granite plate 6. Also, counter force 32 during acceleration and counter force 36 during deceleration of gantry section 3 is expressed by (Mc×a), where a is an accelerating/decelerating speed, and the wobbling amount of granite plate 6 is smaller as this value is smaller. Then, as the wobbling amount is smaller, a reduction is made in a settlement time until the wobble comes to an end.

In this embodiment, since posts 12 and beam 14 of gantry section 3 is formed of CFRP, gantry section 3 is largely reduced in weight as compared with a conventional gantry-type XY stage which has posts 12 and beam 14 formed of iron castings. In other words, the value of aforementioned Mc is smaller. This results in a smaller value of aforementioned (Mc/Ms), making it possible to reduce the wobbling amount of granite plate 6. As a result, it is possible to suppress the wobble of an observed image due to the wobble of the laser optical unit propagated from the granite plate, reduce the settlement time until the wobble comes to end, and reduce a repair processing time. Also, since the gantry section can be moved at higher accelerating/decelerating speeds than before, the gantry section can be moved at high speeds. Thus, a time can be reduced for positioning laser optical unit 20 to improve the efficiency of the repair work. Also, CFRP has a high vibration absorbency and a high vibration restricting effect, and hence can more effectively settle the wobble of the granite plate.

It may be contemplated to form posts 12 and beam 14 of an ordinary resin material for simply reducing the weight of the gantry section. However, if posts 12 and beam 14 are formed of an ordinary resin material, it is not possible to achieve a shape accuracy required for these parts. For highly accurately controlling the position of laser optical unit 20, the height of the top of beam 14 must be strictly consistent, with its maximally allowable error being approximately 10 µm. However, if posts 12 and beam 14 are formed of an ordinary resin, for example, an acrylic resin, the acrylic resin, though lighter than iron castings due to its specific gravity equal to 1.2, has the Young's modulus of only approximately 3 GPa, so that posts 12 and beam 14 would be distorted by their own weights and the mass of laser optical unit 20 and the like. Also, if a pair of linear motors (linear motor stator 11 and linear motor mover 13) for moving gantry section 3 deviate in operation, beam 14 will be twisted. As a result, the height of the top of beam 14 cannot be held consistent.

In contrast, in this embodiment, posts 12 and beam 14 are formed of CFRP in order to maintain the shape accuracy of posts 12 and beam 14 at a level equal to or higher than iron castings and to reduce the weights of these parts. Since CFRP has the Young's modulus in a range of 200 to 600 GPa and is sufficiently high in rigidity, a required shape accuracy can be sufficiently realized. It should be noted that while the material for posts 12 and beam 14 is not limited to CFRP, it is necessary to employ a material, the Young's modulus of which is 200 GPa or higher in order to achieve the required shape accuracy.

Also, in this embodiment, for further reducing the mass of gantry section 3 and further improving the shape accuracy, several faculties have been strained in addition to the formation of posts 12 and beam 14 of a composite material, the Young's modulus of which is 200 GPa or higher, as mentioned above. First, beam 14 is hollow. This results in a further reduction in the weight of beam 14, a reduction in the amount of used expensive CFRP, and a reduction in cost. Also, plate-shaped supporting members 22a to 22d are disposed within shell 21 in beam 14. This can improve the rigidity of beam 14, and correspondingly reduce shell 21 in thickness. As a result, beam 14 can be further reduced in weight, and the amount of used CFRP can be reduced. While this embodiment has shown an example in which the interior of shell 21 is partitioned into seven compartments by four supporting members 22a to 22d, the effect of improving the rigidity of beam 14 can be provided if there is at least one plate-shaped or rod-shaped supporting member which extends in the vertical direction.

Further, backing members 23 are disposed on the back of the top portion of shell 21, bolts 27 are inserted through holes 24 of linear guide bearings 15 and holes 25 of shell 21, and screwed into threaded holes 26 of backing members 23, thereby securing linear guide bearings 15 to beam 14. In this way, as compared with a case where CFRP-made shell 21 is formed with threaded holes into which metal-made bolts are directly screwed, it is possible to prevent the bolts from shaking due to the threaded holes scraped by the bolts to suppress a degradation in the shape accuracy of gantry section 3 over time. Also, when holes 25 are made to be threaded holes, a metal-made or an alloy-made heli-serts may be arranged on the inner walls of the threaded holes, thereby making it possible to provide a similar advantage.

Furthermore, when gantry section 13 is fabricated, beam 14 is first bonded to posts 12 with an adhesive for integration, and subsequently, the top of beam 14 and the bottoms of posts 12 are ground. In this way, the distance between the top of beam 14 and the bottoms of posts 12 can be made strictly consistent, thus accurately aligning the height of the top of beam 14. Also, this grinding process involves sequential performance of the step of grinding an integrated assembly comprised of posts 12 and beam 14 with a large grinding apparatus, and the step of performing manual grinding for finish while measuring the shape using a measuring device. In this way, gantry section 3 can be processed in extremely high accuracy.

In the following, specific values will be given for a comparison of the gantry-type XY stage of this embodiment with a conventional gantry-type XY stage which has posts and beam made of iron castings. First, iron has the specific gravity of 7.9, whereas CFRP has the specific gravity of approximately 1.6 which is approximately 20% of iron. Thus, the total mass of the posts and beam formed of iron castings reaches approximately 600 kg, whereas the total mass of the posts and beam formed of CFRP reaches approximately 120 kg. Also, mass Ms of granite plate 6 is, for example, 10 tons. Thus, the value of aforementioned (Mc/Ms) is approximately 11% for the conventional XY stage whose posts and beam are made of iron castings, whereas it is approximately 6% for the XY stage of this embodiment whose posts and beam are made of CFRP. Thus, in the conventional XY stage, the magnitude of wobble reaches, for example, 5 mm at maximum, and a wobble settlement time until a repair work can be started is, for example, approximately five seconds at maximum. In this embodiment, on the other hand, the magnitude of wobble is, for example, approximately 2 mm at maximum, and a wobble settlement time is, for example, approximately two seconds at maximum, providing for a significant reduction of these values. Also, the conventional gantry-type XY stage can realize the moving speed of the gantry section up to approximately 800 mm/second at most, whereas the gantry-type XY stage according to this embodiment can increase the moving speed of gantry section to 1600 mm/second.

Further, while a recent increase in the size of gantry-type XY stages is associated with an increase in the mass of the gantry section and a need for a linear motor which provides a larger thrust, the ability to reduce the weight of the gantry section according to this embodiment can limit the thrust of the linear motor for moving the gantry section, and prevent an increase in the cost of the gantry-type XY stage.

While this embodiment has shown an example in which a pair of guide bases 7 are disposed on granite plate 6, the present invention is not limited to this, but linear guide bearing 9 and linear scale 10 may be directly attached on the top of granite plate 6 without disposing the guide base, and linear motor stator 11 may be attached directly to a side surface of granite plate 6. In this case, the height of posts 12 must be higher than this embodiment by the thickness of guide base 7.

Also, while this embodiment has shown an example in which a set of gantry section 3 is carried on base section 2, and single movement base 18 is disposed on the set of gantry section 3, the present invention is not limited to this, but a plurality of gantry sections, which move in the Y-direction, may be carried on a single base section, or alternatively, a plurality of movement bases 18, which move in the X-direction, may be disposed on a set of gantry section, and laser optical unit 20 may be mounted on each of movement bases 18. In this way, repairs can be performed simultaneously at a plurality of locations.

Further, while this embodiment has shown an example in which the gantry-type XY stage is incorporated in a liquid crystal display repair apparatus, the present invention is not limited to this, but the gantry-type XY stage according to the present invention can be used suitably for an apparatus which makes any local processing for a large flat structure, and can be incorporated, for example, in a laser repair apparatus for liquid crystal masks, a patterning apparatus for solar cell panels, a defect testing apparatus for liquid crystal displays, a defect testing apparatus for semiconductor devices, and the like. When incorporated in a defect testing apparatus for liquid crystal displays, semiconductor devices or the like, a microscope unit or the like is mounted in place of the laser optical unit.

The gantry-type XY stage according to the present invention can be used suitably for an apparatus which makes any local processing for a large flat structure, for example, a repair apparatus for liquid crystal displays, a laser repair apparatus for liquid crystal masks, a patterning apparatus for solar cell panels, defect testing apparatus for liquid crystal displays, a defect testing apparatus for semiconductor devices, and the like.

What is claimed is:

1. A gantry-type XY stage comprising:
   a granite plate;
   a pair of posts made of a first composite material having a Young's modulus of 200 GPa or more, disposed on said granite plate, and spaced apart from one another in a first direction parallel to a top of said granite plate for movements in a second direction intersecting with the first direction;
   a beam made of a second composite material having a Young's modulus of 200 GPa or more, extended between said pair of posts;
   a movement base disposed for movements in the first direction relative to said beam;
   said beam is a hollow body comprising a shell formed with a first hole through a top thereof, and
   said gantry-type XY stage comprises:
   a linear guide bearing for guiding movements of said movement base which is made of a metal or an alloy, disposed on the top of said beam, and formed with a second hole at a position in alignment to said first hole;
   a backing member made of a metal or an alloy, disposed at a position opposite to said linear guide bearing across said shell within said beam, and formed with a third hole at a position in alignment to said first hole; and a securing member for securing said linear guide bearing to said beam through said second hole, said first hole and said third hole.

2. The gantry-type XY stage according to claim 1, wherein at least one of said first and second composite materials is carbon fiber reinforced plastics.

3. The gantry-type XY stage according to claim 1, wherein:
said third hole is a threaded hole, and said securing member is a bolt screwed into said threaded hole.

4. The gantry-type XY stage according to claim 1, comprising a supporting member made of said second composite material, and extending in a vertical direction within said beam.

5. The gantry-type XY stage according to claim 1, wherein a top of said beam and bottoms of said posts are ground after said beam is bonded to said posts.

6. The gantry-type XY stage according to claim 1, installed in a defect testing apparatus for liquid crystal displays.

7. The gantry-type XY stage according to claim 1, installed in a defect testing apparatus for semiconductor devices.

8. The gantry-type XY stage according to claim 1, comprising a laser irradiator fixed to said movement base.

9. The gantry-type XY stage according to claim 8, installed in a laser repair apparatus for liquid crystal displays.

10. The gantry-type XY stage according to claim 8, installed in a laser repair apparatus for liquid crystal masks.

11. The gantry-type XY stage according to claim 8, installed in a patterning apparatus for solar cell panels.

* * * * *